(12) United States Patent
Pfaff

(10) Patent No.: US 6,270,357 B1
(45) Date of Patent: Aug. 7, 2001

(54) MOUNTING FOR HIGH FREQUENCY DEVICE PACKAGES

(76) Inventor: Wayne K. Pfaff, 309 Steeplechase, Irving, TX (US) 75062

( * ) Notice: Subject to any disclaimer, the term of this patent is extended or adjusted under 35 U.S.C. 154(b) by 0 days.

(21) Appl. No.: 09/546,020

(22) Filed: Apr. 10, 2000

Related U.S. Application Data

(63) Continuation of application No. 09/306,211, filed on May 6, 1999, now abandoned.

(51) Int. Cl.$^7$ ............................. H01R 12/00; H05K 1/00
(52) U.S. Cl. ................................................. 439/71
(58) Field of Search ................... 439/71, 72, 68

(56) References Cited

U.S. PATENT DOCUMENTS

| | | | |
|---|---|---|---|
| 4,035,046 | * 7/1977 | Kloth | 439/71 |
| 5,053,199 | * 10/1991 | Keiser et al. | 422/68.1 |
| 5,309,324 | * 5/1994 | Herandez et al. | 361/734 |
| 5,805,419 | * 9/1998 | Hundt et al. | 361/719 |

* cited by examiner

Primary Examiner—Brian Sircus
Assistant Examiner—Brian S. Webb
(74) Attorney, Agent, or Firm—Dennis T. Griggs

(57) ABSTRACT

Test and/or burn-in sockets for high frequency electronic device packages are formed using contact pins having parallel ends joined by a support beam supported so that one end of the pin extends through a guide into a cavity in the socket and the other end extends through a second guide displaced from the first guide. The outer ends of the contact pins are arranged to contact input/output lands of a external circuitry such as a burn-in board or the like and the inner ends arranged to contact input/output leads or lands on an electronic LGA package. The end portions of the contact pins are constrained in parallel guides which are arranged to precisely align the ends of the pins with the terminal lands and the length and size of the contact pins are minimized to minimize signal distortion.

35 Claims, 3 Drawing Sheets

MOUNTING FOR HIGH FREQUENCY DEVICE PACKAGES

This is a continuation-in-part of application Ser. No. 09/306,211 entitled Mounting For High Frequency Device Packages filed May 6, 1999.

This invention relates to burn-in and test of high frequency devices in small electronic device packages. More particularly, it relates to methods and apparatus for mounting and holding electronic device packages during burn-in and test and to establishing and maintaining positive electrical contact to closely spaced input/output terminal lands or leads on such packages without damaging the electronic device, the device package, its interconnection terminals or the test socket and without introducing unnecessary signal distortion.

Advances in microelectronics technology tend to develop electronic device chips and packages which occupy less space while performing more functions. As a result, the number of electrical interconnections between the device package and external circuitry required for the circuits in the chips to communicate with the outside world increases and the physical size of each such interconnection must decrease. In order to provide electrical communication between the chip and external circuitry, circuit chips are usually contained within a housing or package which supports interconnection pads or lands, leads, balls, etc., on one or more of its external surfaces. In order to reduce overall lead length from chip to external circuitry and to provide adequate spacing between input/output terminals on the package, high pin count devices are sometimes mounted in packages in which the input/output terminals are in the form of conductive lands or pads formed on one or more faces of the package. The lands are often arranged in rows parallel with and adjacent peripheral edges of one face with the surfaces of the lands coplanar and parallel with (but slightly below) the bottom surface of the package. The lands may be arranged in other patterns such as parallel rows which cover the entire bottom surface in a grid pattern; lands grouped near the center of the bottom surface; or various combinations of such arrangements. Such device packages (commonly known as land grid array or LGA packages) may thus be mounted on circuit patterns on the surface of a circuit board or the like so that the terminal lands are bonded to mating lands or pads on the board.

In some device packages terminal balls may be formed on or substituted for the land. Terminal balls are usually a quantity of solder which has been heated so that it forms a liquid sphere by surface tension and thus forms a ball-like protrusion extending from the face of the device package. Such device packages (commonly known as ball grid array or BGA packages) may likewise be mounted to circuit patterns on the surface of a circuit board or the like by bonding the solder balls to mating lands or pads on the board.

In many cases it is desirable that the completed device package be subjected to test and/or burn-in prior to acceptance and assembly onto a circuit board. While the terminals (whether lands or balls) may be directly and permanently surface mounted on a circuit board by soldering, it is much more difficult to establish and maintain temporary electrical contact with each land or ball without destroying or damaging the land or ball, the package or the encapsulated device chip. In order to reliably test and burn-in such packages, the package must be temporarily mounted in a re-useable socket or mounting which makes precision interconnection between the input/output terminals and outside circuitry without introducing signal distortion problems and without physically damaging the device package.

As the size of the package decreases and the number of terminals increases, the size and spacing of terminals become smaller. Smaller and more closely spaced lands are, of course, more difficult to contact with test probes or the like. Furthermore, long or massive contact pins cannot be used for connecting external circuitry to the input/output terminals for testing when high frequency devices are involved because such contact pins, particularly when closely spaced in order to contact closely spaced terminals, introduce unacceptable signal distortion.

Conventional burn-in and test apparatus employs test sockets mounted on a burn-in board with the pin-out leads of the test or burn-in socket passing through the bottom of the socket and through holes in a circuit board in conventional through-hole mountings. Interconnection of high frequency devices with outside circuitry using such conventional mounting can induce unacceptable signal distortion because of the high density of parallel terminal connections passing through the board. Surface mounting of test and burn-in sockets can minimize signal distortion resulting from cross-talk, reactive capacitance, etc., by spreading the interconnection circuitry across the surface of the board and reducing parallel lead lengths.

Miniaturized device packages have now been devised which have very closely-spaced input/output terminal lands on one face of the package. Such device packages, because of their extremely small size, configuration and physical construction, are most difficult to handle without causing damage, yet good electrical contact with all the input/output terminals is essential. With such small packages and such finely-spaced terminals, it is not practical to probe each terminal with an individual wire-like probe. Such probes tend to bend (and thus become mis-aligned); overlap two or more terminals; exert sufficient pressure on the terminal to break or otherwise damage it; or tend to distort and/or bond with the terminal. It is therefore desirable that apparatus be devised in which such small packages may be easily temporarily mounted (preferably by automation) and tested and/or stress-tested by burn-in and the like without damaging the device package or introducing signal distortion problems.

In accordance with the present invention reliable precise electrical contact is provided between input/output lands on small LGA packages (or balls on BGA packages) and external circuitry by mounting apparatus which employs a guide plate and contact pins which extend through guides in the guide plate to contact the input/output terminals on the device package and input/output lands connected with external circuitry. The guide plate is formed of electrically insulating material and has a first set of parallel guides (such as parallel holes or channels) arranged to correspond with the terminal arrangement of the device package. The guide plate may be supported on a support base and either the guide plate or the support base has a second set of parallel guides arranged to correspond with input/output lands connected with external circuit media such as a circuit board, burn-in board or the like. A contact pin having first and second substantially parallel end portions joined by a shank in the form of a support beam is positioned so that the support beam extends from a guide in the first group of parallel guides to a guide in the second group of parallel guides and one end portion of the contact pin extends through a guide in the first group of parallel guides to contact an input/output terminal on a device package supported on or adjacent the guide plate surface. The other end portion of the contact pin extends through the second guide to contact an input/output land on the external circuitry board. The support beam is supported in or on the base support (or the guide plate) and the end portions of the contact pin constrained by the guides so that the ends of the contact pins are precisely aligned with and form electrical contact with the input/output terminals on the device package. The ends of the contact pins are constrained to move only axially by the parallel guides, thus extremely small diameter contact pins can be positioned very close together and form reliable individual contact with very small and closely spaced terminals. Since the contact pins are very small and relatively short, they have very little mass. Capacitance-induced, inductance-induced and impedance-induced signal distortion are thus minimized. With the support beam portion of the contact pin between the two end portions thereof firmly secured in the socket body, the end portions of the contact pin are each isolated from forces applied to the other end so that loading and unloading a device package does not affect the connection between the contact pin and the external circuit board and vice versa. More significantly, the physical distance (the lead length) between the input/output terminal and the external circuitry to which it is connected by the contact pin is minimized and the high density of parallel through-hole leads found in conventional sockets is eliminated. Thus the interconnection arrangement of the invention may be used for test and burn-in of extremely high frequency devices in packages employing very closely spaced terminals without introducing signal distortion problems.

Other features and advantages of the invention will become more readily understood from the following detailed description taken in connection with the appended claims and attached drawing in which:

Figure 1:
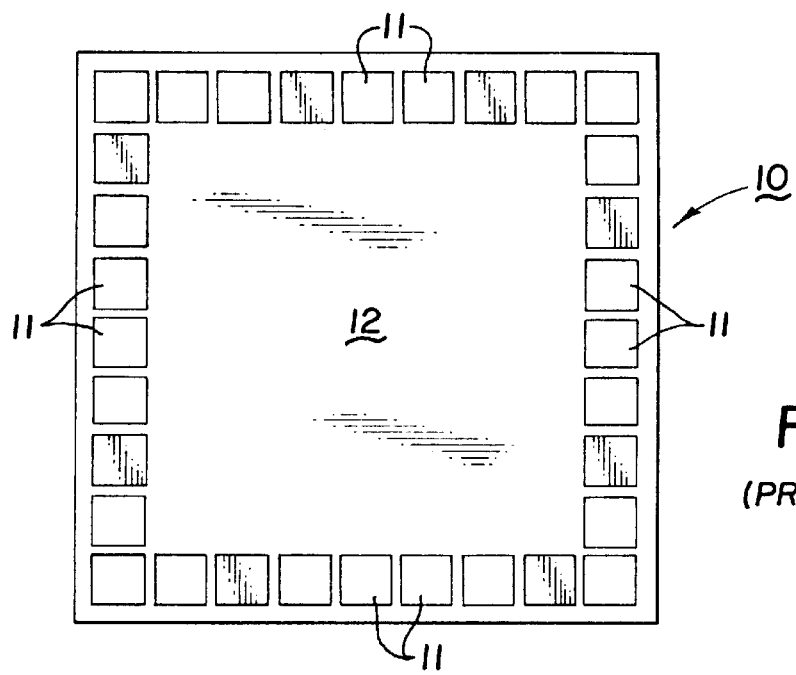
FIG. 1 is a bottom plan view of a typical LGA package employing input/output terminal lands arranged in a single row parallel with and adjacent each of the four peripheral edges of its bottom face.

The drawing is incorporated into and forms part of the specification to illustrate exemplary embodiments of the invention. Throughout the drawing like reference numerals designate corresponding elements. It will be recognized that the principles of the invention may be utilized and embodied in many and various forms. In order to demonstrate these principles, the invention is described herein by reference to specific preferred embodiments. The invention, however, is not limited to the specific forms illustrated and described. Furthermore, the invention is not limited to use in connection with LGA packages of the type illustrated in FIG. 1. For example, the invention is described herein with specific reference to use in connection with LGA and BGA packages with a single row of lands or balls adjacent the periphery of the bottom face. However, sockets employing the principles of the invention may be designed and used to mount, test and burn-in device packages employing any of a wide variety terminal arrangements. The lands or balls may, for example, be arranged in multiple rows, in centralized groups or in a full grid array. Furthermore, for purposes of this invention the terminal balls on BGA device packages may be treated as lands on LGA device packages. Therefore, the terms "land" and "lands" used in reference to a device package should be construed to include input/output lands on LGA packages and input/output terminal balls on BGA packages. In addition, the socket may be designed to accommodate leaded device packages wherein the leads, at some point during fabrication, have a configuration in which the leads may be contacted from the underside (such as packages wherein the leads are held in a molded carrier ring). Sockets may also be designed to contact the underside of leads extending from dual inline packages, gull wing packages or various other packages before (or after) the terminal leads are formed into their final configuration. It is only necessary that the package under test presents a plurality of coplanar lands or terminal lead surfaces which may be directly contacted from the underside of the package by vertically extending ends of contact pins which electrically connect circuitry on the surface of an external board and the terminal ball, land or lead on the device package.

It should also be understood that the invention is not limited to mounting devices for conventional encapsulated packages. For example, input/output terminal lands are sometimes formed on bare chips or flip chip devices to form electrical interconnection with other chips or support media in multi-chip encapsulation packages. For example, a plurality of bare chips having terminal lands are sometimes mounted on a single support mounted within a single encapsulation package. It is often desirable to test these chips prior to assembly so that only "known good die" are ultimately mounted in the multi-chip arrangement. All such chips are characterized by having input/output lands on one face thereof and may be mounted in test sockets employing the principles of the invention. Accordingly, as used herein the term "LGA package" includes any package or chip, whether encapsulated or not, which employs a plurality of substantially coplanar input/output terminal balls, lands or leads extending in a plane substantially parallel with one face of the chip or package which may be physically contacted by the end portion of a contact pin which extends in a direction normal to the plane of the bottom surface of the terminal lands, balls or leads.

A typical LGA package 10 having input/output terminal lands 11 arranged in a row adjacent each of the four peripheral edges of the bottom surface 12 is illustrated in FIG. 1. The lands 11 are typically highly conductive metal such as gold or the like electrically connected with circuitry inside the package 10 and are arranged on the bottom surface 12 to be aligned in register with and soldered to corresponding lands, solder balls or the like on a circuit board, burn-in board, etc., employing conventional surface mount technology. The number and arrangement of lands 11 will depend, of course, on the configuration and size of package 10 and the chip or chips encapsulated therein. As the density of lands 11 on the surface increases, the lands become smaller and the spacing between lands likewise decreases. Modern packages for ultra high frequency devices are often quite small (sometimes referred to as micro-mini packages) and have lands 11 arranged on 0.5 mm centers (ordinarily referred to as 0.5 mm pitch) or less. Obviously, making reliable temporary electrical contact on 0.5 mm pitch lands requires extremely small contact pins which must be maintained in precision alignment.

Figure 2:
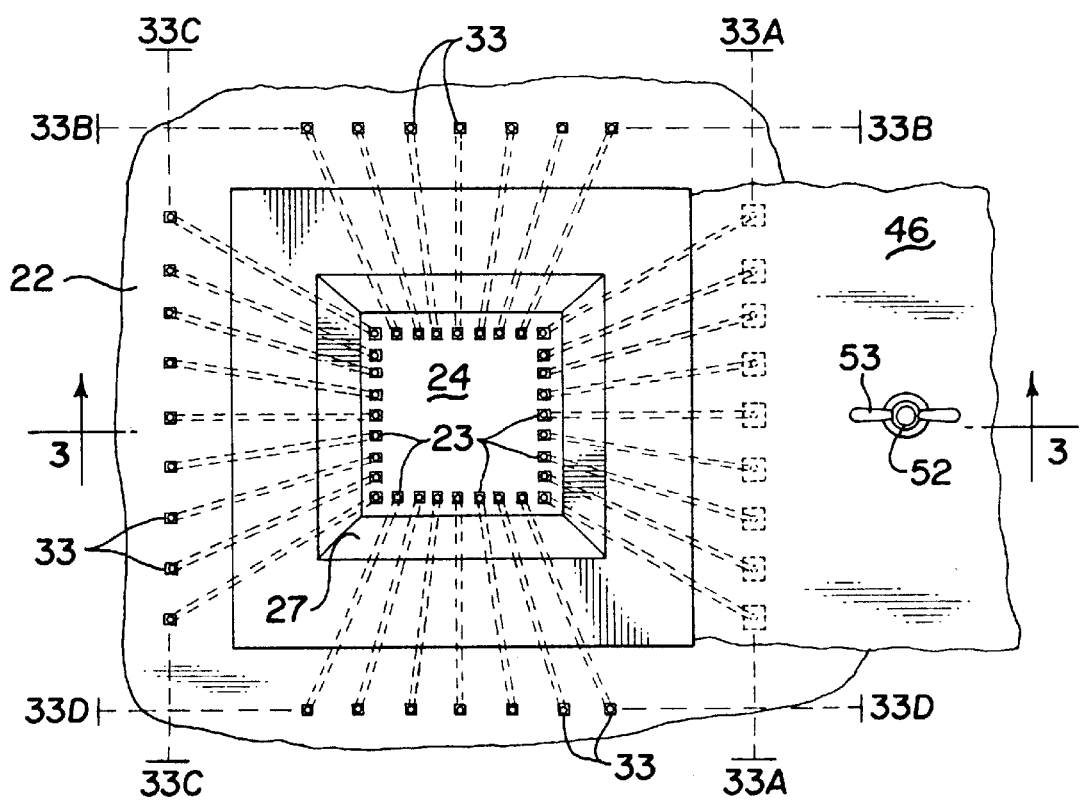
FIG. 2 is a top plan view of mounting apparatus embodying the principles of the invention designed to accommodate the LGA package of FIG. 1.
Figure 3:
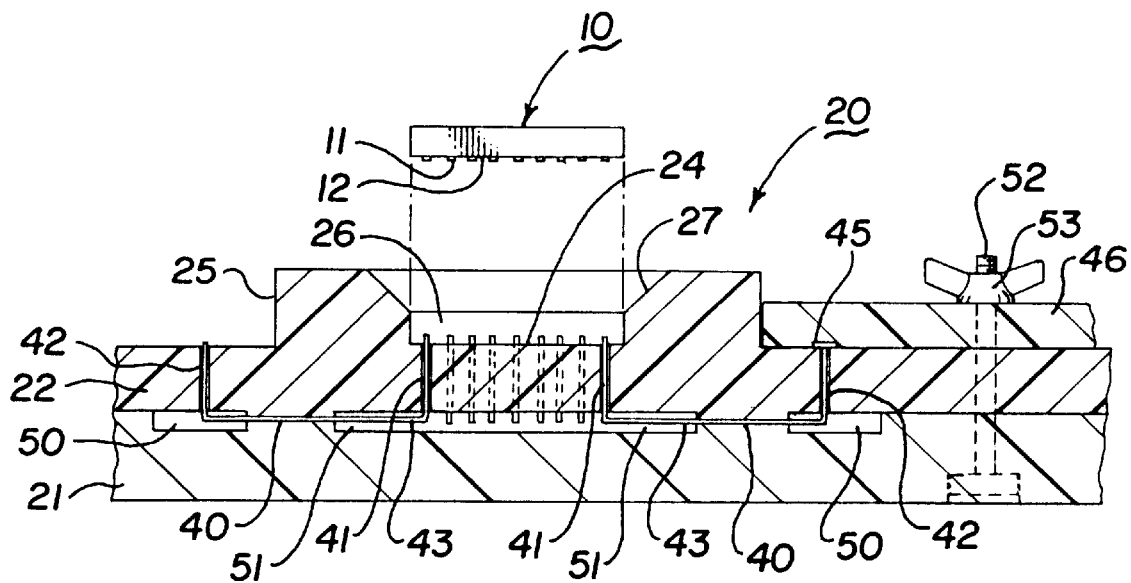
FIG. 3 is a sectional view of the mounting apparatus of FIG. 2 taken through line 3—3.

In the embodiment of the invention shown in FIGS. 2 and 3 a socket or mounting apparatus 20 is formed which has a rigid electrically insulating support base 21 with an electrically insulating guide plate 22 secured to one face thereof. The guide plate 22 has a first set of parallel guides 23 in the form of holes arranged to pass transversely through the guide plate 22 and aligned to coincide with the location of input/output terminal lands 11 on the bottom face of LGA package 10 when LGA package 10 is positioned adjacent the top face 24 of guide plate 22.

Guide plate 22 has a second set of parallel guides 33 aligned parallel with and laterally spaced from first set 23 of guides. In order to minimize the distance between guides in first set 23 and corresponding guides in second set 33, guides in second set 33 are arranged in four rows spaced from and parallel with the edge configuration of the first set of guides. As illustrated in FIG. 2 the first row 33A of guides 33 is aligned with and spaced from the corresponding parallel row of guides 23 in the first set and a corresponding row 33C of guides 33 is spaced from the row of guides 23 which defines the opposite side of the first set of guides 23. Likewise, rows 33B and 33D are arranged parallel with the interconnecting edge rows of the first set of guides 23.

As illustrated in FIG. 3 a contact pin 40 extends between each pair of guides 23 and 33. Each contact pin 40 has an inner end portion 41 and an outer end portion 42 extending in the same direction and parallel with each other joined by a support beam 43. The inner end portion 41 is positioned in a first guide 23 and the outer end portion 42 positioned in a corresponding second guide 33.

In the embodiment illustrated in FIGS. 2 and 3 each contact pin 40 extends from a first guide 23 to the closest second guide 33. Thus the contact pins 40 extending outwardly from each peripheral edge of the first set of guides 23 are substantially parallel with each other. In the embodiment illustrated in FIG. 2 guides 33 are spaced further apart than guides 23 so that the outer end portions 42 of the contact pins are splayed to accommodate wider spacing of input/output terminal lands on the circuit board or the like. This arrangement may, of course, be varied as desired.

In the embodiment illustrated in FIGS. 2 and 3 the inner end portions 41 and outer end portions 42 extend in the same direction and terminate in the same plane. However, the outer end portions 42 may be arranged to terminate in any plane or extend in any direction necessary to mate with terminal lands 45 on a circuit board 46 or the like.

Figure 3A:
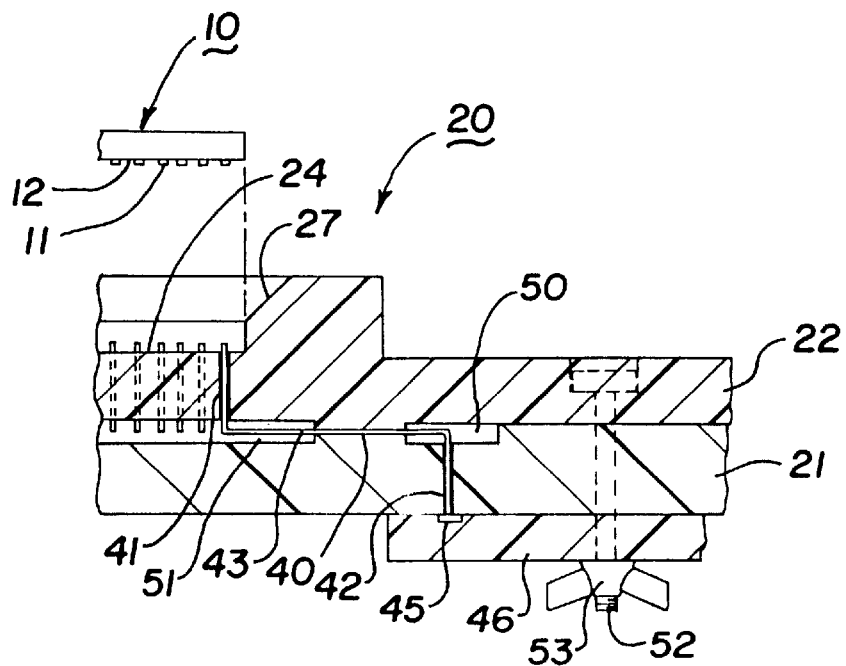
FIG. 3a is a fragmentary sectional view of an alternative arrangement of the apparatus of FIG. 2.

As illustrated in FIG. 3 circuit board 46 is secured to the top surface of guide plate 22 so that terminal lands 45 are aligned with the vertically extending outer end portions 42 of the contact pins 40. It will be readily recognized, however, that outer end portions 42 could extend in the opposite direction through guides (not shown) in the base support 21 and thus contact lands on a circuit board or the like secured to the bottom face of support base 21 as shown, for example, in FIG. 3a.

In the embodiment illustrated in FIGS. 2 and 3 the guide plate 22 includes a lip structure 25 projecting from the upper surface thereof to define a cavity 26 which conforms to the peripheral shape and dimensions of the LGA package 10. Lip structure 25 preferably has an inclined inner surface 27 which acts to guide the LGA package 10 toward the center of the cavity 26 and align the terminal lands with the ends of inner end portions 41. When LGA package 10 is properly located within the cavity 26, each of lands 11 is contacted by an inner end portion 41 of contact pin 40.

In the preferred embodiment of the invention the guides 23 and 33 have a minimum diameter which substantially corresponds with the diameter of the contact pins 40. In the embodiment of FIG. 3 guides 23 and 33 are preferably substantially square holes having a diameter of 0.05 mm and the contact pins 40 are formed from 0.05 mm diameter wire. Accordingly, the 0.05 mm diameter wires fit snugly within the 0.05 mm diameter guides but are axially slideable therein. In order to maintain axial alignment of the end portions 41 and 42 of the contact pins, the guide plate 22 through which the guides 23 and 33 pass should be at least about five millimeters thick when 0.05 mm diameter wire is used for the contact pins 40. Obviously, other dimensions may be used to accommodate various sizes and spacings of terminal lands.

While the use of round wire has been described for forming in the contact pin 40, any other suitable shape of pin material may be used. In the preferred embodiment the contact pins are formed of substantially rigid but flexible material such as steel or a beryllium/copper alloy. To insure good electrical communication between the contact pins 40 and the terminal lands on the circuit board as well as the device package, the contact pins 40 may be coated or plated with a highly conductive material such as gold or the like.

In the embodiment illustrated in FIGS. 2 and 3 the ends of the contact pins 40 extend through the guides 23, 33 and terminate slightly above the face of the guide plate 20. The central portion of each support beam 40 is secured between the opposing faces of the support base 21 and the guide plate 22. In order to control the pressure exerted by the end of end portion 42 on contact pad 45 on the external circuit board, a cavity 50 is formed in the base support 21 below the end portion 42. Thus, when the surface of circuit board 46 is secured adjacent the surface of guide plate 22 as shown in FIG. 3, the end portion 42 of contact pin 40 is urged against terminal land 45. The pressure exerted by the end portion 42 of contact pin 40 against land 45 is determined by the distance which end portion 42 projects (in the relaxed condition) above the surface of guide plate 22 and the bending resistance of support beams 43. The bending resistance of support beam 43, of course, will be determined by the size, shape and composition of support beam 43, the distance which the terminal end of end portion 42 projects above the surface of guide plate 42 in the relaxed condition, and the length of the lever arm defined by that portion of the support beam 43 which extends into cavity 50.

When device package 10 is properly aligned and positioned within cavity 26 with terminal lands 11 in contact with the terminal ends of end portions 41, the pressure exerted on terminal lands 11 can be similarly controlled. For example, the device package 10 may be allowed to simply rest on the end surfaces of the end portions 41. Alternatively, the device package may be urged against the top surface of guide plate 22 by any conventional means such as a hinged lid, pressure fingers, vacuum pencils or the like so that end portions 41 are forced downwardly. This downward movement is limited to the distance which each end portion 41 extends above the surface of guide plate 22 in the relaxed condition. Again, the pressure exerted by each contact pin end against a terminal land 11 will be determined by the size, shape and material composition of the support beam 43 and the axial distance support beam 43 extends into the cavity 51 below the inner end portions 41 of the contact pin (The axial length of support beam 43 which extends into cavity 51). As illustrated in FIG. 3, the axial length of support beam 43 which extends into cavity 51 is longer than the axial length of support beam 43 which extends into cavity 50. Accordingly, if the end portions 41 and 42 extend above the surface of guide plate 22 the same distance, greater pressure will be applied to land 45 by end portion 42 than applied to lands 11 by end portions 41 since the longer axial portion of support beam 43 extending into cavity 51 permits the support beam 43 to flex under less pressure. With the central portion of support beam 43 rigidly secured (either in guide plate 22 or support base 21 or trapped between guide plate 22 and support base 21) flexing of the portion of support beam 43 extending into cavity 51 has no effect on the portion of support beam extending into cavity 50 and vice versa. Accordingly, the pressure applied to terminal lands 45 is totally independent of the pressure applied to terminal lands 11. Furthermore, the pressure to be applied to either set of terminal lands can be adjusted as desired by appropriate selection of variables (material, size and shape of contact pin, distance each end portion 41, 42 extends above the face of guide plate 22, axial length of support beam 43 extending into the cavities, etc.) during design and fabrication of the mounting apparatus.

In the embodiment illustrated in FIG. 3 the mounting apparatus comprises a guide plate 22 and a support base 21 held together by bolt 52 and wingnut 53 which is also used to trap circuit board 46 adjacent guide plate 22. In this configuration the contact pins 40 are trapped between the guide plate 22 and support base 21. Obviously, other configurations may be employed without departing from the inventive principles disclosed. For example, the contact pins may be molded into or otherwise mounted in the guide plate 22, support base 21 or a separate body (not shown) for supporting the contact pins. When the lands on the LGA package are arranged in other patterns (such as multiple rows or grid patterns), the contact pins 40 may be arranged and supported in more than one plane so that the contact pins in the first plane contact lands nearest the periphery of the LGA package and contact pins in lower planes contact lands further from the periphery (see FIG. 6). Likewise, while the embodiment shown in FIGS. 2 and 3 illustrates a cavity 26 in the guide plate 22 to orient an LGA package of the type shown in FIG. 1, various other structures may be employed to receive other types of packages or chips such as bare dies, flip chips, etc., and leaded packages which are configured to be an LGA package as that term is defined herein.

Figure 4:
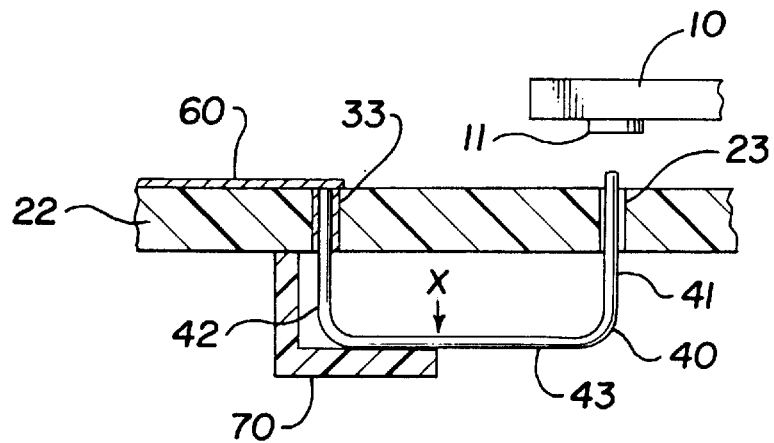
FIG. 4 is a fragmentary partially sectional view of an alternative embodiment of mounting apparatus of the invention illustrating an LGA as the device package.
Figure 5:
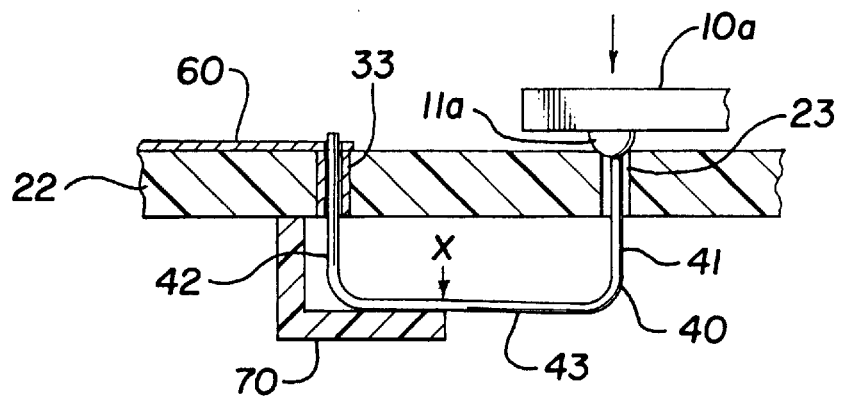
FIG. 5 is a fragmentary partially sectional view of the mounting apparatus of FIG. 4 showing a BGA mounted thereon.
Figure 6:
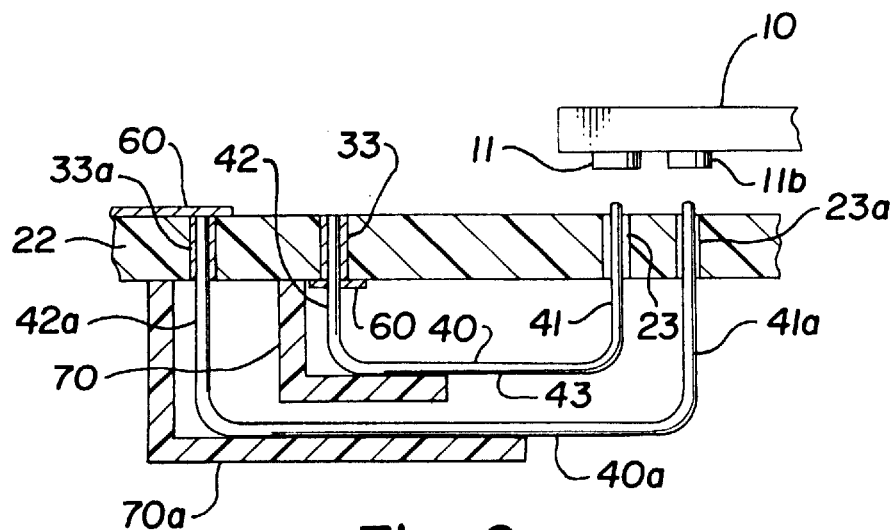
FIG. 6 is a fragmentary partially sectional view of an embodiment of mounting apparatus of the invention which employs a vertically stacked arrangement of contact pins to contact multiple rows of terminals on an LGA package.

In the embodiment illustrated in FIGS. 4, 5 and 6 the guide plate 22 is a support medium in the form of a circuit board or the like which has a plurality of holes passing therethrough. One set of holes 23 is grouped to be aligned in register with input/output terminal lands 11 on LGA package 10 (FIG. 4) or input/output terminal balls 11a on BGA package 10a (FIG. 5). A second set of holes 33 is spaced from the first set 23. A contact pin 40 having an inner end portion 41 and outer end portion 42 substantially parallel with each other connected by a support beam 43 which is not parallel with the end portions 41, 42 interconnects a hole 23 and a hole 33. As shown in FIGS. 4, 5 and 6 the first end portion 41 of contact pin 40 is inserted into a hole in the first set 23 of holes. The holes 23 act as guides for the first end portions 41. The outer end portion 42 is inserted into one of the outer guides 33. The outer end portion 42 may be free to move vertically in outer guide 33 (as described hereinabove with respect to the embodiment of FIG. 3) or may be secured therein. As shown in FIGS. 4, 5 and 6 the outer guides 33 may be plated-through holes or the like which provide electrical communication with circuitry 60. Circuitry 60 may be on the top side of the guide plate 22 (as shown in FIGS. 4 and 5) or on the bottom side or both (as shown in FIG. 6). In the embodiment of FIG. 4 the outer end portion 42 of the contact pin 40 is fixedly secured in the outer guide 33 and electrically connected with outside circuitry 60 by soldering or the like. In the embodiment of FIG. 5 the outer end portion 42 is simply inserted into a plated-through hole and held in physical and electrical contact therewith by the rotational force resulting from downward force being applied to the end of first end portion 41.

In order to maintain the second end portion 42 in guide 33 when second end portion 42 is not secured by soldering or the like and no load is applied to first end portion 41, a support 70 is positioned below the second end portion 42. As shown in FIGS. 4, 5 and 6 support 70 is an L-shaped brace with a vertical leg depending from guide plate 22 and a horizontal leg which supports a substantial portion of the support beam 43. The vertical length of L-shaped brace support 70 determines the distance which second end portion 42 extends into or through guide 33. The length of the horizontal portion determines the fulcrum point x at which support beam 43 is bent and thus determines (in conjunction with the size, resiliency and length of the support beam 43 between point x the inner end portion 41 and the distance which the end of inner end portion extends above the guide plate 22 in the unloaded condition) the pressure exerted on land 11 or ball 11a.

It will be appreciated that when LGA package 10 is moved downwardly (see FIG. 4), the terminal land 11 is urged into contact with the end of inner end portion 41. As the land 11 moves to a position adjacent the face of guide plate 22, first end portion 41 is depressed and support beam 43 bent at fulcrum point x. Likewise, in FIG. 5 the terminal ball 11a is urged into contact with the end of end portion 41 when force is applied downwardly (in the direction of the arrow). It will be readily recognized, therefore, that the inner guides 23 maintain the inner end portions 41 in register with the terminal lands/balls to insure accurate and precise electrical connection. The pressure applied at each connection, of course, is a function of the size, shape and composition of the contact pin 40, the distance the inner end extended above the guide plate, and the distance between fulcrum point x and the inner end portion 41.

The principles of the invention may also be used to connect parallel rows of terminals to outside circuitry. As shown in FIG. 6, a first contact pin 40 as described above is positioned with its end portions in inner guide 23 and outer guide 33. A second contact pin 40a (similar to pin 40 but having longer dimensions) is supported by support 70a so that its end portions 41a and 42a are parallel with but spaced outwardly from end portions 41 and 42 of the first contact pin 40. Likewise, the support beam 43a is parallel with but spaced below support beam 43. In all other respects the longer pin 40a acts in the same manner as contact pin 40 to provide electrical contact between an inner row of lands 11b and outside circuitry.

It will be recognized that all components of the mounting apparatus of the invention may be fabricated from readily available materials using conventional techniques. Of course, when the mounting apparatus is to be used as a burn-in socket, materials must be chosen which will withstand the temperatures involved as well as repeated usage. It will also be recognized that loading and unloading of device packages 20 may readily be automated using conventional techniques. The holes which form guides 23, 33, 23a and 33a may be formed by conventional means such as molding and the like but are particularly suitable for formation by drilling. High speed drills of the sizes required are now commonly available which may be used to form extremely precise and uniform holes at the desired locations. Guides formed by drilling tend to be more precise in accurately positioning the contact pins in register with the lands and may be formed as desired to cooperate with any required pin diameter.

It will be apparent from the foregoing that the principles of the invention may be used to mount and form temporary electrical contact with the terminal leads, balls or lands of various device packages including the terminal lands of micro-mini LGA packages without risk of damaging the device or its input/output terminals. Because of the unique structure, mounting apparatus employing the invention may be used for burn-in and/or test of high frequency devices without concern for signal distortion introduced by the test socket or its interconnection with the burn-in board. It is to be understood, however, that even though numerous characteristics and advantages of the invention have been set forth in the foregoing description together with details of the structure and function of various embodiments, this disclosure is to be considered illustrative only. Various changes and modifications may be made in detail, especially in matters of shape, size, arrangement and combination of parts, without departing from the spirit and scope of the invention as defined by the appended claims.

What is claimed:

1. Mounting apparatus for an electronic device package comprising:
   (a) a support base;
   (b) a guide plate having a first set of substantially parallel guides;
   (c) a second set of substantially parallel guides oriented substantially parallel with and spaced from said first set of substantially parallel guides; and
   (d) at least one contact pin having first and second substantially parallel end portions interconnected by a support beam with said first end portion extending through and constrained by a guide in said first set of parallel guides and the second end portion extending through a guide in said second set of substantially parallel guides and said support beam extending between a first cavity surrounding the end of said support beam which supports said first end portion and a second cavity surrounding the end of said support beam which supports said second end portion.

2. Mounting apparatus as defined in claim 1 wherein said first cavity surrounds a longer axial portion of said support beam than the axial portion of said support beam surrounded by said second cavity.

3. Mounting apparatus for an electronic device package comprising:
   (a) a support base;
   (b) a guide plate having a first set of substantially parallel guides;
   (c) a second set of substantially parallel guides oriented substantially parallel with and spaced from said first set of substantially parallel guides; and
   (d) at least one contact pin having first and second substantially parallel end portions interconnected by a support beam with said first end portion extending through and constrained by a guide in said first set of parallel guides and the second end portion extending through a guide in said second set of substantially parallel guides and said first end portion and said second end portion of said contact pin terminating in substantially the same plane.

4. Mounting apparatus for an electronic device package comprising:
   (a) a guide plate having a first set of substantially parallel guides arranged to be aligned with interconnection terminal surfaces on an electronic device package;
   (b) a second set of substantially parallel guides oriented substantially parallel with and spaced from said first set of substantially parallel guides; and
   (c) at least one contact pin having first and second substantially parallel end portions interconnected by a support beam which is not parallel with said end portions with said first end portion extending through and constrained by a guide in said first set of parallel guides and the second end portion supported in a guide in said second set of substantially parallel guides.

5. Mounting apparatus as defined in claim 4 wherein said first and second substantially parallel end portions extend in the same direction.

6. Mounting apparatus as defined in claim 4 wherein said first and second substantially parallel end portions extend in opposite directions.

7. Mounting apparatus as defined in claim 4 wherein said first end portion and said second end portion of said contact pin terminate in substantially the same plane.

8. Mounting apparatus as defined in claim 4 including structure adjacent the surface of said guide plate which defines an orientation cavity having peripheral inner dimensions substantially corresponding to outer peripheral dimensions of an LGA package to orient the LGA package with respect to the ends of said first end portions of said contact pins extending through said first set of guides.

9. Mounting apparatus as defined in claim 4 wherein said support beam extends between a first cavity surrounding the end of said support beam which supports said first end portion and a second cavity surrounding the end of said support beam which supports said second end portion.

10. Mounting apparatus as defined in claim 9 wherein said first cavity surrounds a longer axial portion of said support beam than the axial portion of said support beam surrounded by said second cavity.

11. Mounting apparatus as defined in claim 4 wherein said first set of parallel guides comprises a plurality of holes which are substantially square in cross-section.

12. Mounting apparatus as defined in claim 4 wherein said second set of parallel guides comprises a plurality of holes which are substantially square in cross-section.

13. Mounting apparatus as defined in claim 4 wherein said second group of parallel guides is arranged in at least two sub-groups, each of which is positioned on opposite sides of said first group of parallel guides.

14. The combination comprising:
   (a) mounting apparatus including:
      (i) a guide plate having a first set of substantially parallel guides;
      (ii) a second set of substantially parallel guides oriented substantially parallel with and spaced from said first set of substantially parallel guides; and
      (iii) at least one contact pin having first and second substantially parallel end portions interconnected by a support beam with said first end portion extending through and constrained by a guide in said first set of parallel guides and the second end portion extending through a guide in said second set of substantially parallel guides; and
   (b) a circuit board having input/output terminal lands secured to said mounting apparatus with at least one of said input/output terminal lands in contact with one of said second end portions projecting through a guide in said second set of substantially parallel guides.

15. Mounting apparatus for an LGA package comprising:
(a) a guide plate having a first set of substantially parallel guides arranged to be aligned with contact pads on an LGA package and a second set of substantially parallel guides oriented substantially parallel with and spaced from said first set of substantially parallel guides;
(b) at least one contact pin having first and second substantially parallel end portions interconnected by a support base which is not parallel with said end portions with said first end portion extending through a guide in said first set of parallel guides and the second end portion positioned in a guide in said second set of substantially parallel guides; and
(c) a support retaining the second end portion in a substantially fixed position.

16. Mounting apparatus as defined in claim 15 wherein said support is an L-shaped body depending from said guide plate which has a vertical portion and a horizontal portion with the horizontal portion supporting a substantial portion of said support beam.

17. Mounting apparatus as defined in claim 15 wherein said second end portion is secured in a guide in said second set of substantially parallel guides with solder.

18. Mounting apparatus as defined in claim 17 wherein the solder securing said second end portion is in electrical communication with circuitry in the top face of the guide plate.

19. Mounting apparatus as defined in claim 17 wherein the solder securing said second end portion is in electrical communication with circuitry in the bottom face of the guide plate.

20. Mounting apparatus as defined in claim 15 including a third set of substantially parallel guides arranged to be aligned with contact pads on an LGA package and a fourth set of substantially parallel guides oriented parallel with and spaced from said third set of substantially parallel guides with at least one contact pin having first and second substantially parallel end portions interconnected by a support beam which is substantially parallel with the support beam interconnecting the first and second end portions of the contact pad having its first end portion in a guide in said first set of substantially parallel guides.

21. Mounting apparatus for an LGA package comprising:
(a) a support base;
(b) a guide plate having a first set of substantially parallel guides arranged to be aligned with contact pads on an LGA package;
(c) a second set of substantially parallel guides oriented substantially parallel with and spaced from said first set of substantially parallel guides; and
(d) at least one contact pin having first and second substantially parallel end portions interconnected by a support beam which is not parallel with said end portions with said first end portion extending through and constrained by a guide in said first set of parallel guides and the second end portion extending through a guide in said second set of substantially parallel guides.

22. Mounting apparatus as defined in claim 21 wherein said first and second substantially parallel end portions extend in the same direction.

23. Mounting apparatus as defined in claim 21 wherein said first and second substantially parallel end portions extend in opposite directions.

24. Mounting apparatus as defined in claim 21 wherein said first end portion and said second end portion of said contact pin terminate in substantially the same plane.

25. Mounting apparatus as defined in claim 21 including structure on the surface of said guide plate which defines an orientation cavity having peripheral inner dimensions substantially corresponding to outer peripheral dimensions of an LGA package to orient the LGA package with respect to said first end portions of said contact pins extending through said first set of guides.

26. Mounting apparatus as defined in claim 21 wherein said support beam extends between a first cavity surrounding the end of said support beam which supports said first end portion and a second cavity surrounding the end of said support beam which supports said second end portion.

27. Mounting apparatus as defined in claim 26 wherein said first cavity surrounds a longer axial portion of said support beam than the axial portion of said support beam surrounded by said second cavity.

28. Mounting apparatus as defined in claim 21 wherein said first set of parallel guides comprises a plurality of holes which are substantially square in cross-section.

29. Mounting apparatus as defined in claim 21 wherein said second set of parallel guides comprises a plurality of holes which are substantially square in cross-section.

30. Mounting apparatus as defined in claim 21 wherein said second group of parallel guides is arranged in at least two sub-groups, each of which is positioned on opposite sides of said first group of parallel guides.

31. The combination comprising:
(a) mounting apparatus including:
  (i) a support base;
  (ii) a guide plate having a first set of substantially parallel guides;
  (iii) a second set of substantially parallel guides oriented substantially parallel with and spaced from said first set of substantially parallel guides; and
  (iv) at least one contact pin having first and second substantially parallel end portions interconnected by a support beam with said first end portion extending through and constrained by a guide in said first set of parallel guides and the second end portion extending through a guide in said second set of substantially parallel guides; and
(b) a circuit board having input/output terminal lands secured to said mounting apparatus with at least one of said input/output terminal lands in contact with one of said second end portions projecting through a guide in said second set of substantially parallel guides.

32. Mounting apparatus for an LGA package comprising:
(a) a support base;
(b) a guide plate having a first set of substantially parallel guides;
(c) a second set of substantially parallel guides oriented substantially parallel with and spaced from said first set of substantially parallel guides; and
(d) at least one contact pin having first and second substantially parallel end portions interconnected by a support beam with said first end portion extending through and constrained by a guide in said first set of parallel guides and the second end portion extending through a guide in said second set of substantially parallel guides and said support beam extending between a first cavity surrounding the end of said support beam which supports said first end portion and a second cavity surrounding the end of said support beam which supports said second end portion.

33. Mounting apparatus as defined in claim 32 wherein said first cavity surrounds a longer axial portion of said support beam than the axial portion of said support beam surrounded by said second cavity.

34. Mounting apparatus for an LGA package comprising:
(a) a support base;
(b) a guide plate having a first set of substantially parallel guides;
(c) a second set of substantially parallel guides oriented substantially parallel with and laterally spaced from said first set of substantially parallel guides; and
(d) at least one contact pin having first and second substantially parallel end portions interconnected by a support beam which extends laterally between said parallel end portions with said first end portion extending through and constrained by a guide in said first set of parallel guides and the second end portion extending through a guide in said second set of substantially parallel guides.

35. Mounting apparatus as defined in claim 34 wherein said first end portion and said second end portion of said contact pin terminate in substantially the same plane.

* * * * *